(12) United States Patent
Shigehiro et al.

(10) Patent No.: US 7,569,837 B2
(45) Date of Patent: Aug. 4, 2009

(54) ION SOURCE

(75) Inventors: Nishino Shigehiro, Kyoto (JP); Ono Ryoichi, Kyoto (JP)

(73) Assignee: Kyoto Institute of Technology (JP)

( * ) Notice: Subject to any disclaimer, the term of this patent is extended or adjusted under 35 U.S.C. 154(b) by 251 days.

(21) Appl. No.: 11/780,651

(22) Filed: Jul. 20, 2007

(65) Prior Publication Data

US 2008/0067411 A1 Mar. 20, 2008

Related U.S. Application Data

(63) Continuation of application No. PCT/JP2006/303567, filed on Feb. 27, 2006.

(30) Foreign Application Priority Data

Feb. 28, 2005 (JP) .......................... P2005-053762
Feb. 27, 2006 (WO) ................ PCT/JP2006/003567

(51) Int. Cl.
*H01J 49/10* (2006.01)
*H01J 49/12* (2006.01)
*H01J 27/02* (2006.01)
*H01J 27/22* (2006.01)

(52) U.S. Cl. .............. 250/423 R; 250/425; 315/111.81; 315/111.41; 315/111.31; 313/230; 313/231.41

(58) Field of Classification Search ............. 250/423 R, 250/425; 315/111.81, 111.41, 111.31; 313/230, 313/231.41
See application file for complete search history.

(56) References Cited

U.S. PATENT DOCUMENTS 4,714,860 A * 12/1987 Brown et al. ........... 315/111.81
4,785,220 A * 11/1988 Brown et al. ........... 315/111.81

* cited by examiner

*Primary Examiner*—Nikita Wells
(74) *Attorney, Agent, or Firm*—Thomas, Kayden, Horstemeyer & Risley, LLP.

(57) ABSTRACT

It is a technical challenge to provide a small-sized ion source excellent in operability.

An ion source of the present invention includes: a cylindrical insulation tube (2) opened upward and opened at part of its lower surface; a plurality of hollow cylindrical permanent magnets (3), provided on the outer peripheral surface of the insulation tube to be arranged in a row in the axial direction of the insulation tube; a gas supplying means (34, 35, 20) for supplying gas into the insulation tube; a cathode electrode, at the tip end of which a fitting unit (19) for fitting of a solid material (18) there to is formed; an annular anode electrode (5), which is fitted to an opening in the lower surface of the insulation tube; an upper frame (6), which blocks the upper portion of the insulation tube and suspends the cathode electrode so as to allow the fitting unit to approach the anode electrode; and a lower frame (7), in which an extraction port (37) is formed for extracting ions emitted from the anode electrode, and on which the insulation tube is mounted.

7 Claims, 9 Drawing Sheets

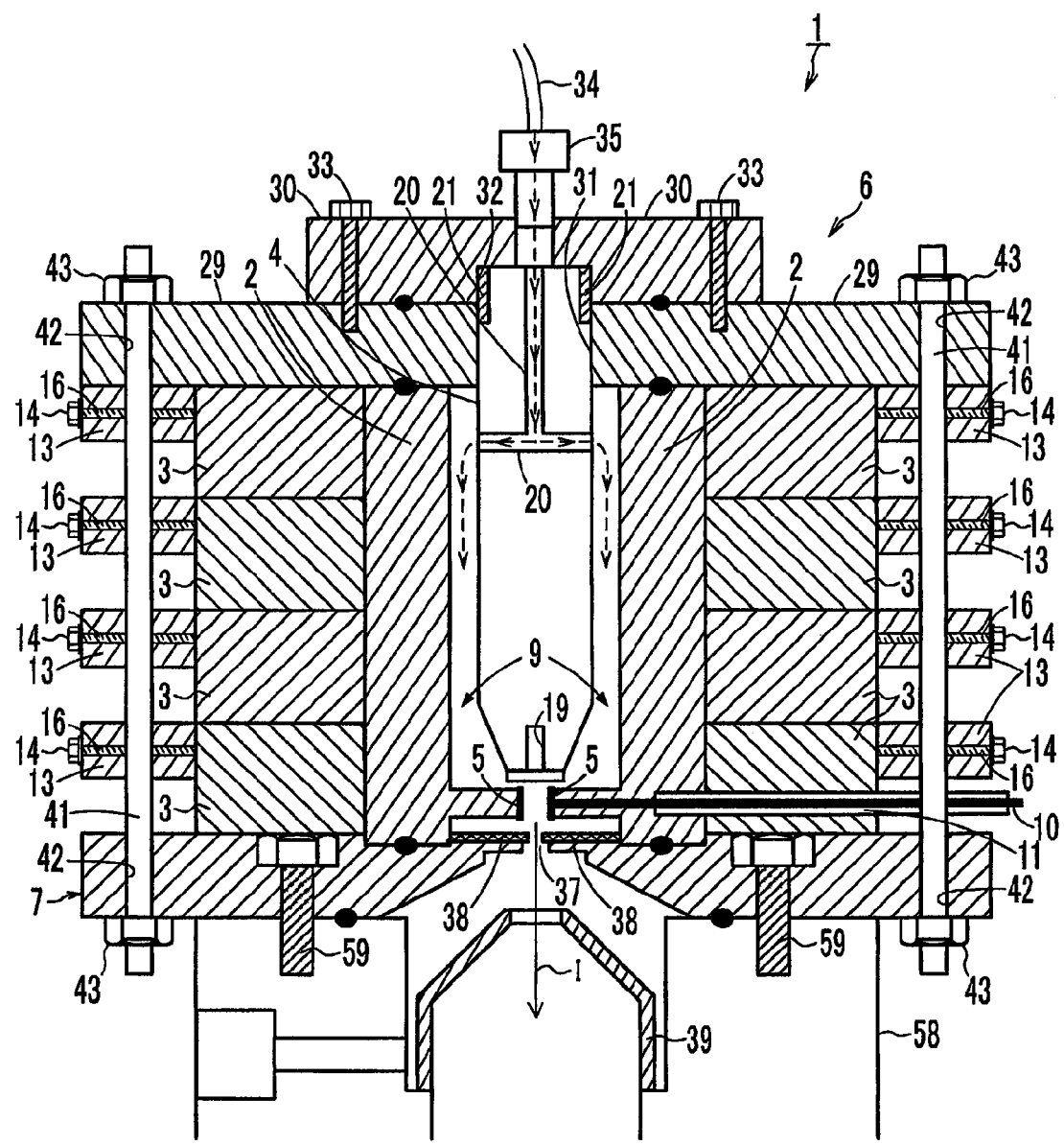
[FIG.1]

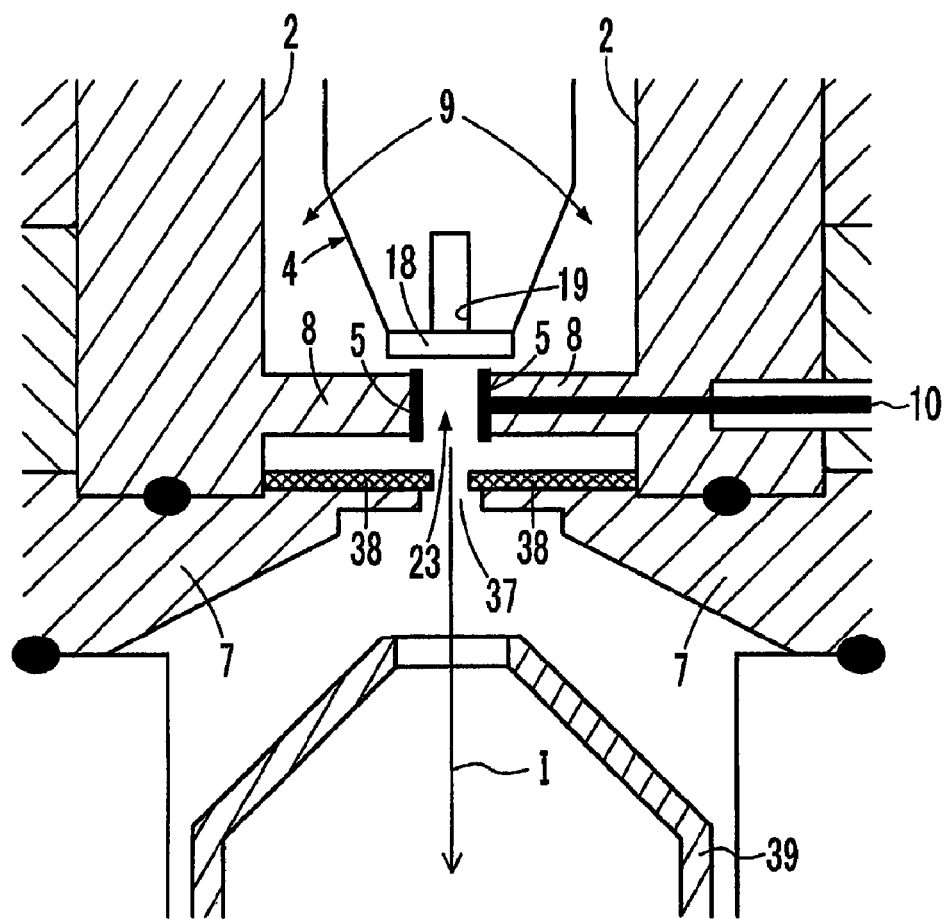
[FIG.2]

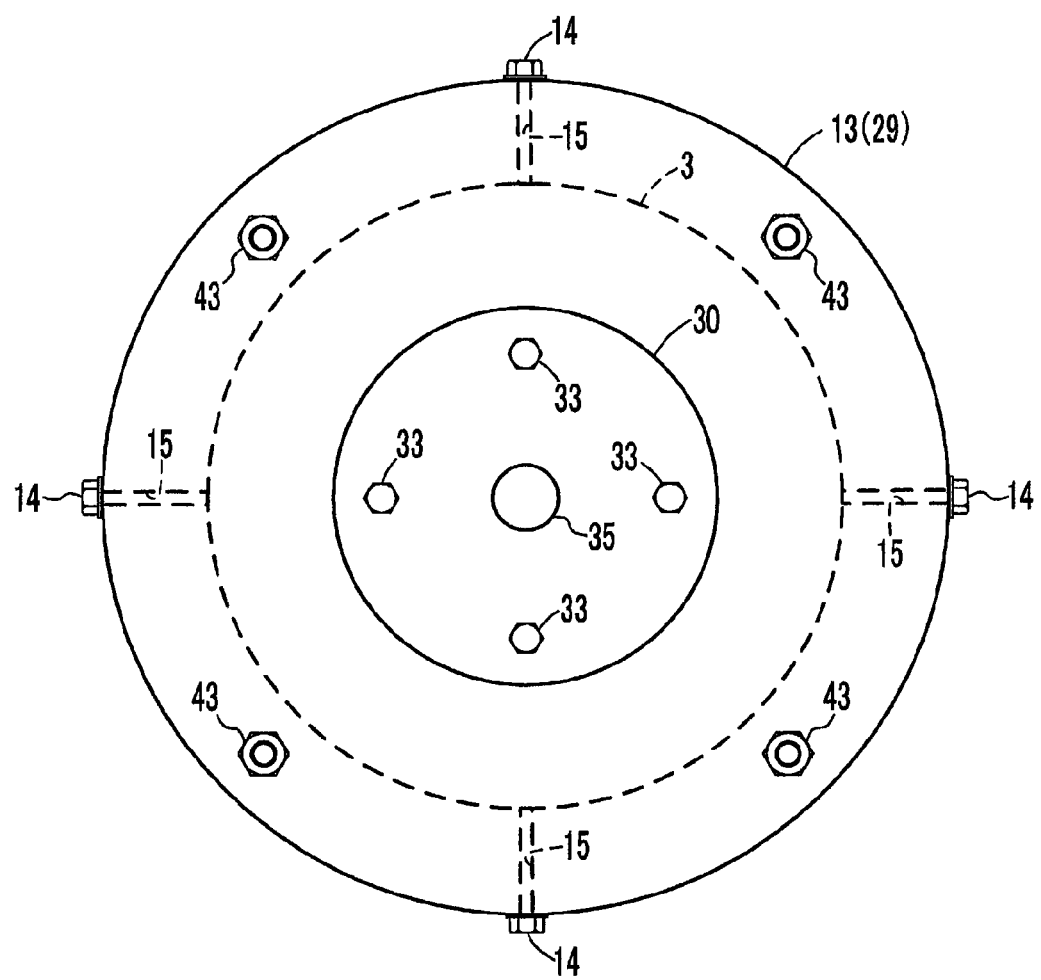
[FIG.3]

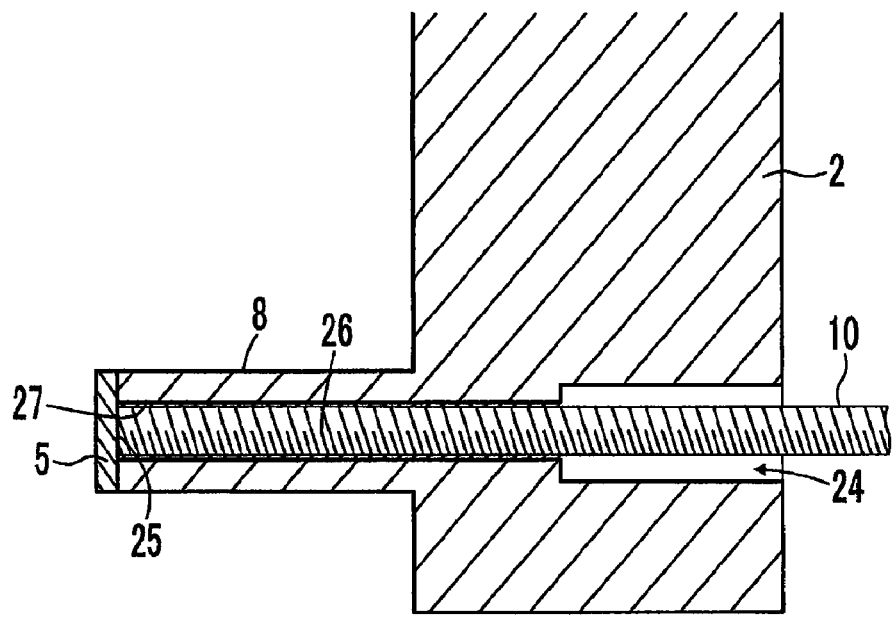
[FIG.4]

[FIG.5]
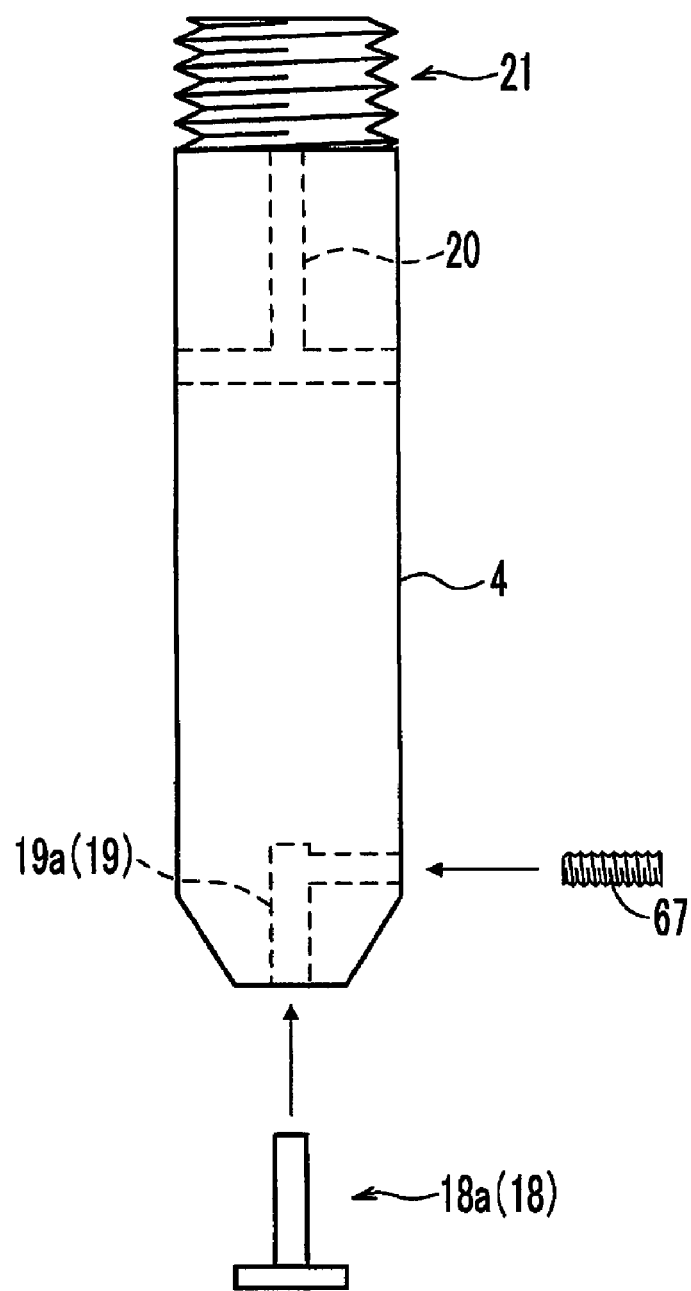

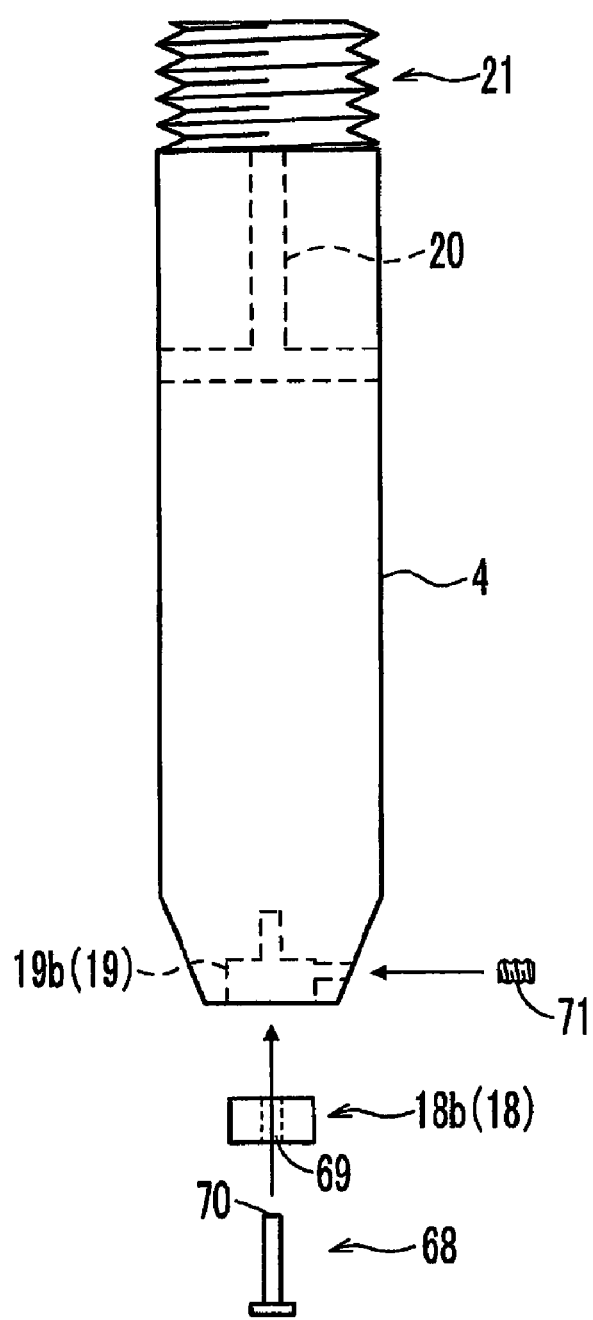
[FIG.6]

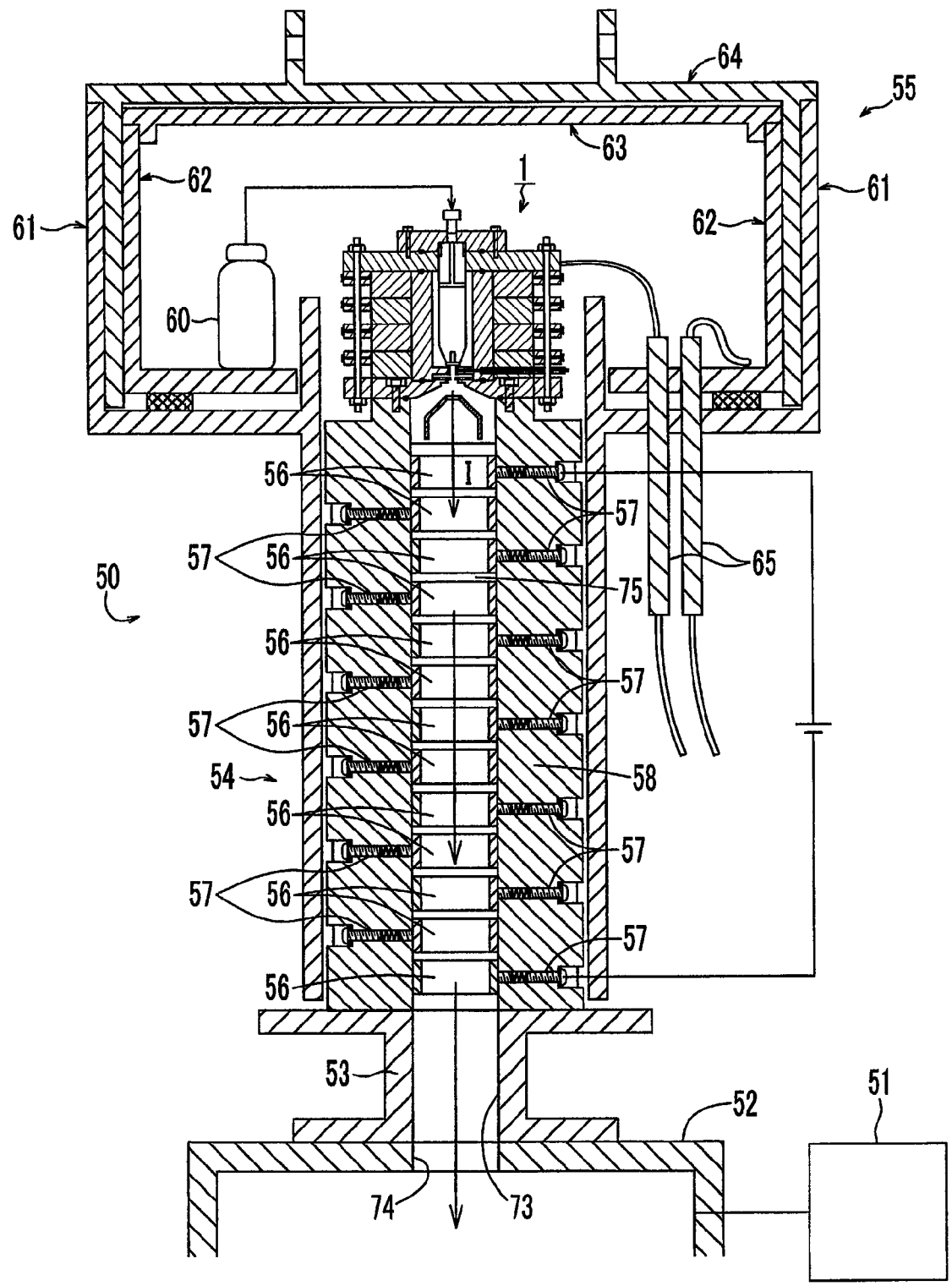
[FIG.7]

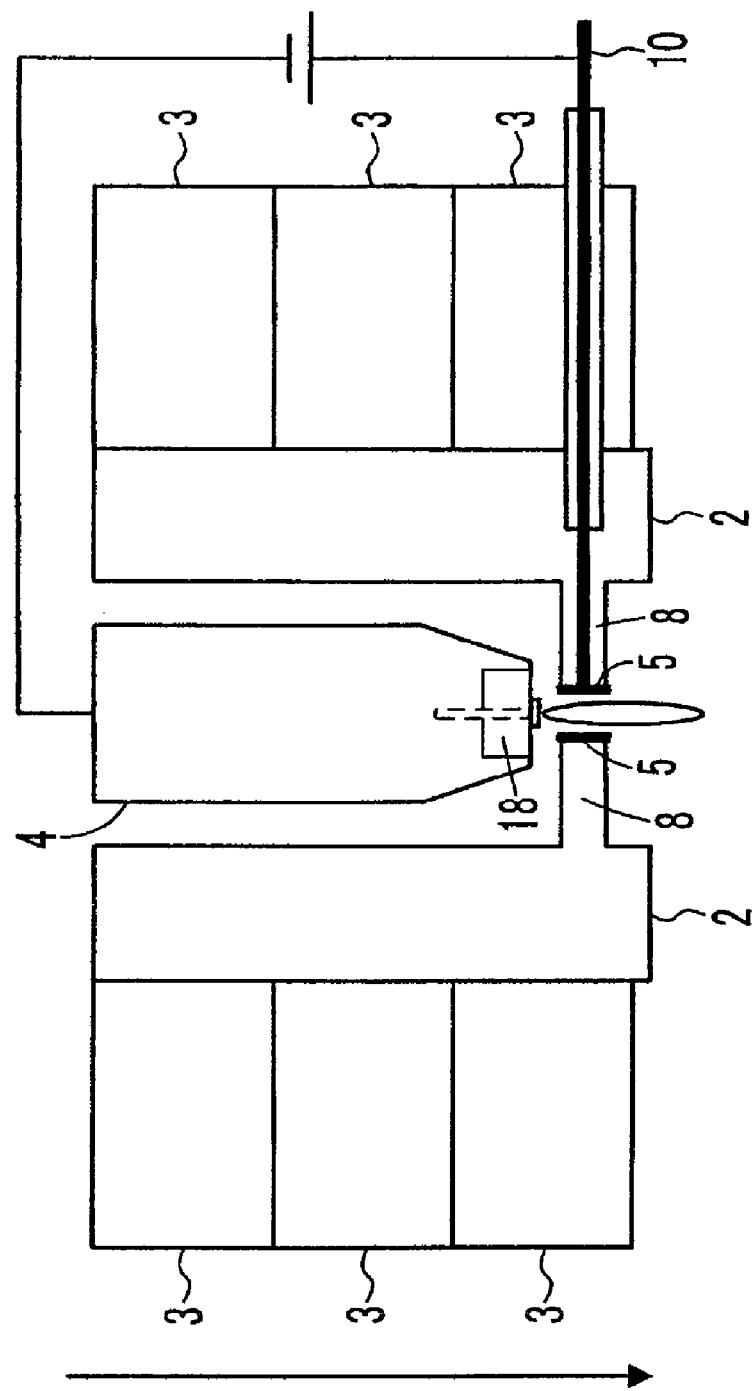
[FIG.8]

[FIG.9]
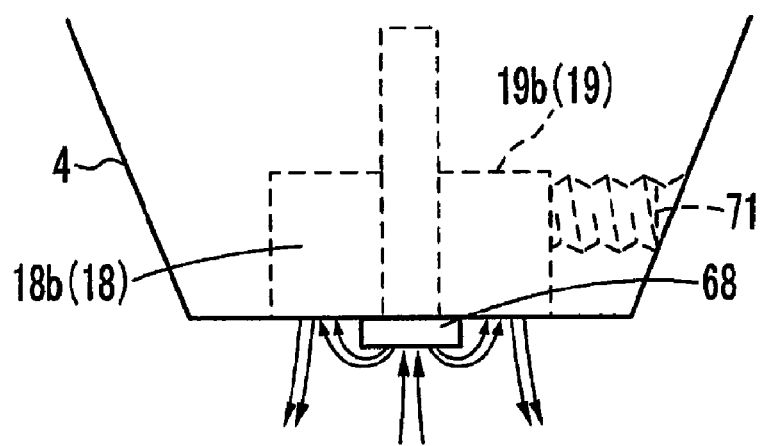

ION SOURCE

CROSS-REFERENCE TO RELATED APPLICATION

This application is a continuation application which claims priority to PCT Application No. PCT/JP2006/303567, filed Feb. 27, 2006, which claims priority to Japanese Patent Application No. P2005-053762, filed on Feb. 28, 2005.

TECHNICAL FIELD

The present invention relates to an ion source, and specifically a sputter type ion source which sputters the surface of a solid material to generate ions.

BACKGROUND ART

As a technique of this kind, there has hitherto been a sputter type ion source of a so-called hot cathode system, in which a sputter electrode is constituted of a material intended to be ionized and a negative voltage is applied to the sputter electrode to emit sputter particles, and the emitted sputtered particles are ionized through the use of thermoelectrons emitted from a filament (see Patent Document 1, for example). Patent Document 1: Japanese Patent Laid-Open Application No. 2003-306767

DISCLOSURE OF INVENTION

Problems that Invention is to Solve

In the sputter type ion source of the hot cathode system as the device disclosed in Patent Document 1, there have been cases where a filament is heated to high temperature, and an electromagnet is additionally used for concentrating plasma, thereby requiring a cooling device or the like. This has caused a problem of increasing the ion source in size.

As opposed to this, a sputter type ion source of a so-called cold cathode system has been contrived, with a simple electrode structure as compared with that of the hot cathode system, but many of such ion sources have complicated device configuration, thereby causing a problem of preventing the user from readily making cleaning, maintenance and the like of the device.

The present invention was made in view of the above problems, and has an object to provide a small-sized ion source excellent in operability.

Means to Solve the Problems

In order to achieve the above object, an ion source according to claim 1 is characterized by including: a cylindrical insulation tube, opened upward and opened at part of its lower surface: a magnetic field generating means, provided on the outer peripheral surface of the insulation tube; a gas supplying means for supplying gas into the insulation tube; a cathode electrode, at the tip end of which a fitting unit for fitting of a solid material thereto is formed, and which is arranged in the inner space of the insulation tube; an annular anode electrode, which is fitted to an opening in the lower surface of the insulation tube, to emit at its center ions generated in the inner space of the insulation tube; an upper frame, which blocks the upper portion of the insulation tube and suspends the cathode electrode so as to allow the fitting unit to approach the anode electrode; and a lower frame, in which an extraction port is formed for extracting ions emitted from the anode electrode, and on which the insulation tube is mounted.

An ion source according to claim 2 is characterized in that the magnetic field generating means are a plurality of hollow cylindrical permanent magnets provided on the outer peripheral surface of the insulation tube to be arranged in a row in the axial direction of the insulation tube.

An ion source according to claim 3 is characterized in that a handle is fixed to the outer peripheral surface of the plurality of permanent magnets.

An ion source according to claim 4 is characterized in that the gas supplying means is a gas feeding-in hole formed in the cathode electrode connected with a gas supply source.

An ion source according to claim 5 is characterized in that the cathode electrode fixes an insulating solid material to a fitting unit formed at its tip end by means of a pin which has conductive properties and is electrically connected with the fitting unit.

An ion source according to claim 6 is characterized in that a shaft inserted through an insertion hole formed in the upper frame and lower frame is fixed by clamping to couple the upper frame and the lower frame so that the insulation tube is fixed to the upper frame and the lower frame.

An ion source according to claim 7 is characterized in that the ion source is used as an ion source of an ion implanting device.

According to the ion source of claim 1, since the cathode electrode is hanged by the upper frame, there is an advantage that the cathode electrode can be readily taken out from the insulation tube by pulling the upper frame upward so as to facilitate setting and the like of the solid material fitted to the fitting unit formed at the tip end of the electrode.

According to the ion source of claim 2, since the permanent magnets are used as means for generating a magnetic field in the inner space of the insulation tube, it is not necessary to provide a cleaning means needed in the case of using an electromagnet, thereby allowing reduction in size of the ion source.

According to the ion source of claim 3, there is an advantage that the permanent magnets strongly adhering to one another can be readily separated by holding the handles, so as to facilitate cleaning and maintenance of the ion source.

According to the ion source of claim 4, since the gas feeding-in hole for supplying gas for discharge to the inner space of the insulation tube is formed inside the cathode electrode, the device is compact compared with the case of providing the gas feeding-in hole in another portion, thereby allowing reduction in size of the ion source.

According to the ion source of claim 5, since fixing is made by means of the pin having conductive properties, not only a conductive solid material but also an insulating solid material can be used.

According to the ion source of claim 6, the upper frame and the insulation tube can be readily removed by releasing the clamp of the shaft. This can facilitate cleaning and maintenance of the ion source.

According to the ion source according to claim 7, there is an advantage that the use of the ion source as an ion source of an ion implanting device leads to improvement in operability of the ion implanting device.

BEST MODE FOR CARRYING OUT THE INVENTION

In the following, an ion source according to an embodiment of the present invention is described based upon FIGS. 1 to 9. An ion source (charged-particle source) 1 according to the embodiment of the present invention is an ion source of a PIG (Penning Ionization Gauge) type using an orthogonal electromagnetic field, and includes an insulation tube 2, a plurality of permanent magnets 3 as magnetic field generating means, a cathode electrode 4, an anode electrode 5, an upper frame 6, and a lower frame 7, as shown in FIG. 1.

As shown in FIGS. 1 and 2, the insulation tube 2 is a cylindrical container opened upward and opened at a part of its lower surface 8. This insulation tube 2 is constituted of an insulating material and formed, for example, with an outer diameter of the order of 60 mm, an internal diameter of the order of 30 mm, a thickness of the order of 15 mm, and a length of the order of 80 mm. As the insulating material constituting this insulation tube 2, for example, alumina, macol, boron nitride (BN), and the like can be cited. It is to be noted that the internal diameter, the external diameter, the thickness, the length and the like of the insulation tube 2 are not particularly restricted, but changeable as appropriated according to the need.

The permanent magnet 3 generates a magnetic field in the axial direction in an inner space 9 of the insulation tube 2 and is formed, for example, in hollow cylindrical shape with an outer diameter of the order of 120 mm, an internal diameter of the order of 60 mm, a thickness of the order of 30 mm, and a length of the order of 20 mm, as shown in FIGS. 1 and 3. The plurality of (here, four) permanent magnets 3 are provided on the outer peripheral surface of the insulation tube 2 to be arranged in a row in the axial direction of the insulation tube 2, and these plurality of permanent magnets 3 form a magnetic field in the axial direction with a magnetic flux density of the order of 500 Gauss in the inner space 9 of the insulation tube 2. It is to be noted that on the permanent magnet 3 at the lowermost level, a through hole 11 is formed for insertion therethrough of an electrode rod 10 electrically connecting the anode electrode 5 and a direct current power source provided outside the figure. For this reason, the permanent magnet 3 at the lowermost level is made of iron magnetized in consideration of the strength.

A handle 13 is fixed to the outer peripheral surface of the permanent magnet 3. A bolt hole 15 is formed in this handle 13 such that a bolt 14 penetrates the bolt hole 15 in its diameter direction. A female screw (not shown) into which a male screw 16 of the bolt 14 is screwed is formed in the bolt hole 15. The male screws 16 of the bolt 14 is hinged into each of the bolt holes 15 from the outside and the tip end of the bolt 14 presses the outer peripheral surface of the permanent magnet 3 so that the handle 13 is fixed to the outer peripheral surface of each of the plurality of permanent magnets 3. Therefore, by pulling this handle 13 upward, the user can relatively readily lift the permanent magnet 3 upward which absorbs another permanent magnet 3 by suction power of each other, so as to readily disassemble the ion source 1. Although the permanent magnets 3 as thus described are desirably used as the magnetic field generating means since such a use avoids the need to provide a cleaning means and allows reduction in size of the ion source, electron magnets may also be used and these are also included in the present invention.

As shown in FIGS. 1, 2, 5, and 6, the cathode electrode 4 is formed, for example, in longitudinal cylindrical shape with an external diameter of the order of 20 mm and a height of the order of 90 mm. As metal constituting this cathode electrode 4, for example, iron (Fe) is cited. In this cathode electrode 4, a fitting unit 19 for fitting of a solid material 18 thereto is formed at the tip end, and as a gas supplying means, a gas feeding-in hole 20 is formed for supplying gas to the inner space 9 in the state of being arranged in the inner space 9 of the insulation tube 2. As shown in the figure, the gas feeding-in hole 20 is formed to penetrate the inside of the cathode electrode 4 so as to connect the rear end of the cathode electrode 4 and the outer peripheral surface of the cathode electrode 4, and gas for discharge or material gas can be supplied to the inner space 9 of the insulation tube 2 through this gas feeding-in hole 20. Further, a male screw 21 for coupling the cathode electrode 4 to the upper frame 6 is formed in the vicinity of the rear end of the outer peripheral surface of the cathode electrode 4. As for the gas supply means, it is desirable to form the gas feeding-in hole for supplying gas for discharge to the inner space of the insulation tube inside the cathode electrode as in the present embodiment, since the device becomes compact as compared with the case of providing the gas feeding-in hole in another portion, thereby to allow reduction in size of the ion source. However, for example, the gas feeding-in hole may be formed in another portion in a method where the gas feeding-in hole is provided in a frame plate 29 and a hanging member 30 and gas is supplied to the inner space 9, a method where the gas feeding-in hole is provided in the permanent magnet 3 and the insulation tube 2 and gas is supplied to the inner space 9, and some other methods, and these are also included in the present invention.

As shown in FIGS. 1, 2, 4, and 8, the anode electrode 5 is formed in annular shape so as to be joined with an opening 23 of the lower surface 8 of the insulation tube 2. As metal constituting this anode electrode 5, for example, tungsten (W) is cited. A thorough hole 24 for penetration therethrough of the electrode rod 10 in the diameter direction of the insulation tube 2 is formed on the lower surface 8 of the insulation tube 2, with which anode electrode 5 is joined, and a tip end 25 of the electrode rod 10 provided to penetrate the through hole 24 and be in intimate contact with the insulation tube 2 is in contact with the outer peripheral surface of the anode electrode 5 while a rear end of the electrode rod 10 is electrically connected to the direct current power source, so that the anode electrode 5 is electrically connected with the direct current power source.

It is to be noted that the male screw 26 is formed in the electrode rod 10 while a female screw 27 is formed in part of the through hole 24, and the electrode rod 10 is hinged into the through hole 24 from the outside. In addition, as metal constituting the electrode rod 10, for example, stainless is cited.

As shown in FIGS. 1 and 3, the upper frame 6 hangs the cathode electrode 4 such that the upper portion of the insulation tube 2 is blocked and the fitting unit 19 approaches the anode electrode 5, and is constituted of a frame plate 29 and a hanging member 30 in the present embodiment. The frame plate 29 is formed, for example, in disc shape with an external diameter of the order of 160 mm and a height of the order of 15 mm, and a cathode electrode insertion hole 31 is formed such that the cathode electrode 4 can be inserted therethrough. As a material constituting the frame plate 29, for example, iron is cited. The hanging member 30 is formed in disc shape with an external diameter of the order of 80 mm and a height of the order of 13 mm, and its lower surface side, a concave portion 32 is formed, into which the rear end of the cathode electrode 4 is inserted. It is to be noted that the hanging member 30 is fixed to the frame plate 29 by means of a bolt 33.

Although not shown in the figure, a female screw is formed in this concave portion 32 in its axial direction, and thereby, the male screw 21 on the rear end side of the cathode electrode 4 is hinged to the hanging member 30. Therefore, the cathode electrode 4 can be taken out from the inner space 9 of the insulation tube 2 by removing the bolt 33 and lifting the hanging member 30 upward. This can facilitate setting of the solid material 18 to the fitting unit 19 of the cathode electrode 4. Further, a coupling member 35 for coupling a gas tube 34 connected with the gas supply source provided outside the figure and the gas feeding-in hole 20 of the cathode electrode 4 is fixed to the upper surface side of the hanging member 30, and gas is supplied to the inner space 9 of the insulation tube 2 through the gas tube 34, the coupling member 35, and the gas feeding-in hole 20.

It is to be noted that, although the cathode electrode 4 is coupled with the hanging member 30 here, a female screw may be provided in the frame plate 29 to couple the cathode electrode 4 with the frame plate 29. Further, the upper frame 6 made up of the frame plate 29 and the hanging member 30 may be comprised of one disc member.

As shown in FIGS. 1 and 2, the lower frame 7 is formed, for example, in disc shape with an external diameter of the order of 160 mm and a height of the order of 15 mm, and the insulation tube 2, the permanent magnet 3, and the like are mounted on this lower frame 7. As a material constituting the lower frame 7, for example, iron is cited. An extraction port 37 for extracting ions generated in the inner space 9 of the insulation tube 2 and emitted through a hollow portion of the anode electrode 5 is formed in the lower frame 7.

Further, the lower frame 7 is provided with an extraction electrode 38 and an extraction electrode 39 on the edge of the extraction port 37 and below the lower frame 7. By application of an extraction voltage to between the extraction electrodes 38 and 39, ions generated in the inner space 9 of the insulation tube 2 are extracted from the insulation tube 2.

It should be noted that in the frame plate 29 of the upper frame 6 and the lower frame 7, a shaft 41 with male screws formed at both ends of its outer peripheral surface is inserted through an insertion hole 42 formed in the upper frame 6 and the lower frame 7, and the male screw is hinged by cramping the nut 43 to couple the upper frame 6 and the lower frame 7, so as to fix the insulation tube 2 to the upper frame 6 and the lower frame 7. Therefore, by removal of the nut 43 from the shaft 41, the upper frame 6 that hangs the cathode electrode 4, the permanent magnets 3 and the insulation tube 2 can be lifted upward so that the ion source 1 can be readily disassembled. This allows the user to readily make cleaning and maintenance of the ion source 1.

The ion source 1 configured as thus described can be used for an accelerator 50 as in FIG. 7. As shown in the figure, this accelerator 50 includes: a vacuum container 52 connected with a vacuum pump 51; an acceleration tube 54 provided in a standing condition through a stage member 53 on the vacuum container 52; and an ion generating device 55 provided in the upper portion of the acceleration tube 54.

The acceleration tube 54 applies an acceleration voltage V to accelerate ions I emitted from the ion source 1 of the ion generating device 55, and includes a plurality of acceleration electrodes 56 and a plurality of terminal bolts 57. The acceleration electrode 56 is formed in an annular shape so as to be in intimate contact with the inner peripheral surface of the acceleration tube main body 58, and the plurality of acceleration electrodes 56 are provided to be arranged in a row in the axial direction of the acceleration tube main body 58 at prescribed intervals. A male screw of the terminal bolt 57 is hinged from the outside into each bolt hole formed so as to penetrate through the acceleration tube main body 58 in its diameter direction, and the tip end of the terminal bolt 57 is in contact with the acceleration electrode 56 so that terminal bolt 57 and the acceleration electrode 56 are electrically connected to each other. Further, a voltage dividing resistor (not shown) is provided among each of the terminal bolts 57, and when the acceleration voltage V is applied to between the uppermost acceleration electrode 56 and the lowermost acceleration electrode 56, the acceleration voltage V is divided by a plurality of voltage dividing resistors to the acceleration electrodes 56. It is to be noted that the lower frame 7 of the ion source 1 is fixed to the acceleration tube main body 58 by means of the bolt 59.

Other than the above-mentioned ion source 1, the ion generating device 55 includes a gas cylinder 60 which supplies the ion source 1 with gas for discharge, a first box-shaped insulating member 61, a second box-shaped insulating member 62, an insulating lid member 63, an inverse box-shaped insulating member 64, and a direct current power source (not shown).

The first box-shaped insulating member 61 is a box-shaped member opened upward. An insertion member 65, formed in cylindrical shape for insertion therethrough of a power supply line for supplying power from the direct current power source to the ion source 1 and a variety of control lines, is joined to the bottom of the first box-shaped insulating member 61. The second box-shaped insulating member 62 is a box-shaped member opened upward, which is housed inside the first box-shaped insulating member 61 and whose side walls and bottom are spaced by a prescribed distance from the side walls and the bottom of the first box-shaped insulating member 61 adjacent to the outside. The insulating lid member 63 is an insulating member in plate shape mounted on the upper ends of the side walls of the second box-shaped insulating member 62 so as to block the upper opening of the second box-shaped insulating member 62. The inverse box-shaped insulating member 64 is an insulating member in inverse box shape opened downward such that each of its side walls is inserted into a space between each of the side walls of the two adjacent box-shaped insulating members, the first and second box-shaped insulating members 61 and 62.

In a case of sputtering the solid material 18 to generate ions and accelerating the generated ions by means of the acceleration tube 54 in the ion source 1, the user sets the ion source 1, the direct current power source, the gas cylinder 60, and the like in a state where the second box-shaped insulating member 62 is opened upward.

First, the user removes the bolt 33 and lifts the hanging member 30 of the upper frame 6 upward, to take out the cathode electrode 4 from the insulation tube 2. Here, in the case of using a conductive material as the solid material 18 for a material intended to be obtained by sputtering, as shown in FIG. 5, a conductive solid material 18a (18) with its cross section molded in substantially T-shape is inserted into a fitting unit 19a (19) of the cathode electrode 4 and fixed by means of a bolt 67.

On the other hand, in the case of using an insulating material as the solid material 18 for the material intended to be obtained by sputtering, as shown in FIG. 6, an insulating solid material 18b (18) is fixed to a fitting unit 19b (19) of the cathode electrode 4 by means of a pin having conductive properties (conductive pin 68), for example made of Al. As shown in the figure, the conductive pin 68 with its horizontal portion having an area smaller than the area in the horizontal direction of the solid material and with a vertical portion having a length larger than the height of the solid material 18b is employed. An insulation hole 69 is formed in the solid material 18b such that the vertical portion of the conductive pin 68 can be inserted therethrough, and the solid material 18b is fixed to the fitting unit 19b of the cathode electrode 4 by means of a bolt 71 in a state where a tip end 70 of the vertical portion of the conductive pin 68 projected from the upper surface of the solid material 18b is electrically connected with the cathode electrode 4. Here, as the insulating solid material 18b to be used, for example, BN, $S_3N_4$, BC, AlN, and the like can be cited.

As thus described, after the conductive or insulating solid material 18 has been fixed to the tip end of the cathode electrode 4, the hanging member 30 is mounted on the frame plate 29 while the cathode electrode 4 is inserted into the inner space 9 of the insulation tube 2, and the frame plate 29 and the hanging member 30 are fixed to each other by means of the bolt 33. Thereby, the inner space 9 of the insulation tube 2 where the cathode electrode 4 has been inserted is blocked.

After completion of the setting of the ion source 1, the direct current power source, the gas cylinder 60 and the like, the user mounts the insulating lid member 63 on the upper ends of the side walls of the second box-shaped insulating member 62, and further inserts each of the side walls of the inverse box-shaped insulating member 64 into between each of the side walls of the first box-shaped insulating member 61 and the second box-shaped insulating member 62 to mount the inverse box-shaped insulating member 64 on the upper ends of the side walls of the first box-shaped insulating member 61, so as to block the upper portion of the first box-shaped insulating member 61 and the second box-shaped insulating member 62.

By operation of the vacuum pump 51 such as a rotary pump and a turbo pump, the inner space 9 of the insulation tube 2 and the inner space 75 of the acceleration tube main body 58, communicating with the inside of the vacuum container 52 through the communicating hole 73 provided in the stage member 53 and the communicating hole 74 provided in the vacuum container 52, is reduced in pressure to come into a high vacuum state. Thereby, the inner space 75 of the acceleration tube main body 58 is reduced in pressure to the order of $10^{-7}$ Torr, and the inner space 9 of the insulation tube 2 is reduced in pressure to the order of $10^{-3}$ Torr since the extraction port 37 and the extraction electrode 38 provided in the lower frame 7 function as apertures.

As thus described, with the inner space 9 of the insulation tube 2 being reduced in pressure to come into a suitable vacuum state, when rare gas having a high sputtering rate, such as nitrogen (N) and argon (Ar), is supplied as gas for discharge from the gas cylinder 60 to the inner space 9 of the insulation tube 2, and a prescribed high voltage (e.g. the order of 3 kV) is applied from the direct current power source to between the anode electrode 5 and the cathode electrode 4, the supplied gas for discharge is discharged between the anode electrode 5 and the cathode electrode 4, to generate positive ions of the gas for discharge. When a conductive material is used as the solid material 18, the generated positive ions of the gas for discharge are concentrated on the central axis due to the magnetic field in the axial direction generated by the permanent magnet 3, and collide with the solid material 18a at the tip end of the cathode electrode 4 to which a negative voltage has been applied, and by sputtering, particles of the solid material 18a are sputtered from the surface of the solid material 18a.

It is to be noted that in the case of using an insulating material as the solid material 18, as shown in FIG. 9, part of the positive ions of the gas for discharge having collided with the surface of the conductive pin 68 collides with the surface of the solid material 18b, and particles of the solid material 18b are sputtered by sputtering. For example, in the case of using a conductive pin 68 made of aluminum (Al) and the solid material 18b made of boron nitride (BN), ions of nitrogen (N), boric acid (B) and aluminum (AL) can be generated.

As thus described, the ions I sputtered from the surface of the solid material 18 by sputtering of positive ions of the gas for discharge are extracted from the inner space 9 of the insulation tube 2 to the inner space 75 of the acceleration tube main body 58 by an extraction voltage applied to between the extraction electrode 38 and the extraction electrode 39, and emitted in the downward direction of the inner space 75 of the acceleration tube main body 58 so as to correspond to the central axis of the inner space 75. It is to be noted that charged particles emitted from the ion source 1 are not restricted to the ions I, but electrons or the like can obviously be emitted.

Meanwhile, in the acceleration tube main body 58, when an acceleration voltage is applied to between the uppermost acceleration electrode 56 and the lowermost acceleration electrode 56, the ions I emitted from the ion source 1 are accelerated in multiple stages by a divided voltage of the acceleration voltage applied to each of the acceleration electrodes 56 in the inner space 75 of the acceleration tube main body 58 reduced in pressure to come into the high vacuum state. The accelerated ions I are separated by means of an E×B mass separator (Wien Filter) provided outside the figure which is connected to the acceleration tube 54, and only necessary ions are extracted. The extracted ions can be utilized for improvement in surfaces of a variety of materials, and the like.

While the ion source 1 according to the present embodiment can be used as a sputter-type ion source as thus described, ions may also be generated by the use of a material gas. Namely, the ion source 1 is capable of using either solid or air raw material as a raw material for generating ions.

In the case of using the material gas, a material resistant to sputtering, such as tungsten (W), is fixed to the fitting unit 19 of the cathode electrode 4 in place of the solid material 18. The material gas is supplied to the inner space 9 of the insulation tube 2 along with the gas for discharge, and when a prescribed high voltage is applied from the direct current power source to between the anode electrode 5 and the cathode electrode 4, the material gas is ionized by positive ions of the gas for discharge having been discharged. Ions of the material gas ionized in such a manner are extracted by the extraction voltage so that the ions of the material gas can be obtained.

INDUSTRIAL AVAILABILITY

The present invention is applicable to a sputter type ion source which generates ions by sputtering the surface of a solid material.

BRIEF DESCRIPTION OF DRAWINGS

FIG. 1 is a sectional view of an ion source according to an embodiment of the present invention.

FIG. 2 is an expanded sectional view of the lower surface of an insulation tube and its periphery.

FIG. 3 is a plan view of the ion source.

FIG. 4 is a sectional view showing an anode electrode and an electrode rod.

FIG. 5 is an explanatory view showing the condition of fixing a conductive solid material to a fitting unit of the cathode electrode.

FIG. 6 is an explanatory view showing the condition of fixing an insulating solid material to the fitting unit of the cathode electrode.

FIG. 7 is a sectional view showing an accelerator for which the ion source according to the embodiment of the present invention.

FIG. 8 is an explanatory view showing the condition of ions being emitted from the ion source.

FIG. 9 is an explanatory view schematically showing the condition of particles of the insulating solid material being sputtered from its surface by sputtering.

BRIEF EXPLANATION OF THE DRAWINGS

1 Ion source
2 Insulation tube
3 Permanent magnet (Magnetic field generating means)
4 Cathode electrode
5 Anode electrode
6 Upper frame
7 Lower frame
8 Lower surface
9 Inner space
13 Handle
18 Solid material
19 Fitting unit
20 Gas feeding-in hole (Gas supplying means)
23 Opening
29 Frame plate
30 Hanging member
37 Extraction port
41 Shaft
42 Insertion hole
43 Nut
68 Conductive pin

The invention claimed is:

1. An ion source, comprising:
a cylindrical insulation tube, opened upward and opened at part of its lower surface:
a magnetic field generating means, provided on the outer peripheral surface of said insulation tube;
a gas supplying means for supplying gas into said insulation tube;
a cathode electrode, at the tip end of which a fitting unit for fitting of a solid material thereto is formed, and which is arranged in the inner space of said insulation tube;
an annular anode electrode, which is fitted to an opening in the lower surface of said insulation tube, to emit at its center ions generated in the inner space of said insulation tube;
an upper frame, which blocks the upper portion of said insulation tube and suspends said cathode electrode so as to allow said fitting unit to approach said anode electrode; and
a lower frame, in which an extraction port is formed for extracting ions emitted from said anode electrode, and on which said insulation tube is mounted.

2. The ion source according to claim 1, wherein said magnetic field generating means are a plurality of hollow cylindrical permanent magnets provided on the outer peripheral surface of said insulation tube to be arranged in a row in the axial direction of said insulation tube.

3. The ion source according to claim 2, wherein a handle is fixed to the outer peripheral surface of said plurality of permanent magnets.

4. The ion source according to claim 1, wherein said gas supplying means is a gas feeding-in hole formed in said cathode electrode connected with a gas supply source.

5. The ion source according to claim 1, wherein said cathode electrode fixes an insulating solid material to a fitting unit formed at its tip end by means of a pin which has conductive properties and is electrically connected with said fitting unit.

6. The ion source according to claim 1, wherein a shaft inserted through an insertion hole formed in said upper frame and lower frame is fixed by clamping to couple said upper frame and said lower frame so that said insulation tube is fixed to said upper frame and said lower frame.

7. The ion source according to claim 1, wherein said ion source is used as an ion source of an ion implanting device.

* * * * *